(12) United States Patent
Styles (10) Patent No.: US 6,859,041 B2
(45) Date of Patent: Feb. 22, 2005

(54) METHODS FOR LOCATING FAULTS IN AIRCRAFT BRANCH CONDUCTORS AND DETERMINING THE DISTANCE TO THE FAULTS

(75) Inventor: Robert G. Styles, Granger, IN (US)

(73) Assignee: Honeywell International, Inc., Morristown, NJ (US)

( * ) Notice: Subject to any disclaimer, the term of this patent is extended or adjusted under 35 U.S.C. 154(b) by 136 days.

(21) Appl. No.: 10/304,288

(22) Filed: Nov. 26, 2002

(65) Prior Publication Data

US 2004/0100272 A1 May 27, 2004

(51) Int. Cl.$^7$ ............................................. G01R 31/11
(52) U.S. Cl. ..................... 324/523; 324/527; 324/533; 324/534
(58) Field of Search ................................. 324/522, 523, 324/527, 528, 533, 534, 537; 702/79, 108

(56) References Cited

U.S. PATENT DOCUMENTS

| | | | |
|---|---|---|---|
| 4,538,103 A | 8/1985 | Cappon | 324/534 |
| 4,739,276 A | 4/1988 | Graube | 324/534 |
| 4,766,386 A | 8/1988 | Oliver et al. | 324/533 |
| 4,838,690 A | 6/1989 | Buckland et al. | 356/73.1 |
| 5,134,377 A | 7/1992 | Reddy, III. et al. | 324/533 |
| 5,352,984 A | 10/1994 | Piesinger | 324/532 |
| 5,369,366 A | 11/1994 | Piesinger | 324/533 |
| 5,381,348 A | 1/1995 | Ernst et al. | 324/534 |
| 5,440,528 A | 8/1995 | Walsh | 368/113 |
| 5,479,610 A | 12/1995 | Roll-Mecak et al. | 714/25 |
| 5,514,965 A | 5/1996 | Westwood | 324/533 |
| 5,586,054 A | 12/1996 | Jensen et al. | 324/533 |
| 5,751,149 A | 5/1998 | Oberg et al. | 324/533 |
| 5,801,953 A | 9/1998 | Thoma et al. | 702/68 |
| 5,977,773 A | 11/1999 | Medelius et al. | 324/520 |
| 6,016,464 A | 1/2000 | Richardson | 702/79 |
| 6,026,145 A | 2/2000 | Bauer et al. | 379/22.03 |
| 6,137,293 A | 10/2000 | Wu et al. | 324/638 |
| 6,437,578 B1 | 8/2002 | Gumm | 324/533 |
| 6,442,498 B1 | 8/2002 | Krigel | 702/108 |
| 6,448,781 B1 * | 9/2002 | Frank et al. | 324/533 |
| 6,534,997 B1 * | 3/2003 | Horishita et al. | 324/534 |
| 6,677,761 B1 * | 1/2004 | Greulich | 324/533 |

* cited by examiner

*Primary Examiner*—Vincent Q. Nguyen
(74) *Attorney, Agent, or Firm*—K. Karen Loewenstein, Esq.

(57) ABSTRACT

A method for isolating a fault in an aircraft circuit having a lead conductor and a plurality of branch conductors coupled to the lead conductor is disclosed. The method includes coupling a reference line of a device to a ground of the lead conductor, coupling a supply/return line of the device to the lead conductor, supplying an impulse signal to the supply/return line, and receiving a reflected signal that is produced from the impulse signal. The method also includes determining whether a fault exists in the plurality of branch conductors using the reflected signal, coupling the reference line of the device to a ground of the plurality of branch conductors, coupling the supply/return line of the device to one of the plurality of branch conductors, and supplying a signal to the supply/return line.

12 Claims, 12 Drawing Sheets

METHODS FOR LOCATING FAULTS IN AIRCRAFT BRANCH CONDUCTORS AND DETERMINING THE DISTANCE TO THE FAULTS

BACKGROUND OF THE INVENTION

1. Field of the Invention

The present invention relates generally to methods for detecting faults in branch conductors in aircraft wire harnesses, and more particularly to methods for locating faults in aircraft branch conductors and determining the distance to the faults.

2. Description of the Related Art

Many electrical systems, such as those found on aircraft, can be tested for faults and failures resulting from defective or improperly mated connectors, or breaks or shorts in the conductor, e.g., the wire or cable. For example, conductors connecting the cockpit controls to the engines or other aircraft components can have a break in them that may, in extreme circumstances, cause the loss or malfunctioning of a particular system of the aircraft. Therefore, aircraft electrical systems are tested in an attempt to avoid these types of faults and failures.

In order to test these systems, each conductor can be individually and separately tested to ensure that it is operating and functioning correctly. Before the testing is performed, however, the conductors are generally disconnected from the associated electrical system. Once a conductor is disconnected, a testing device is used to test for faults and failures.

Figure 1:
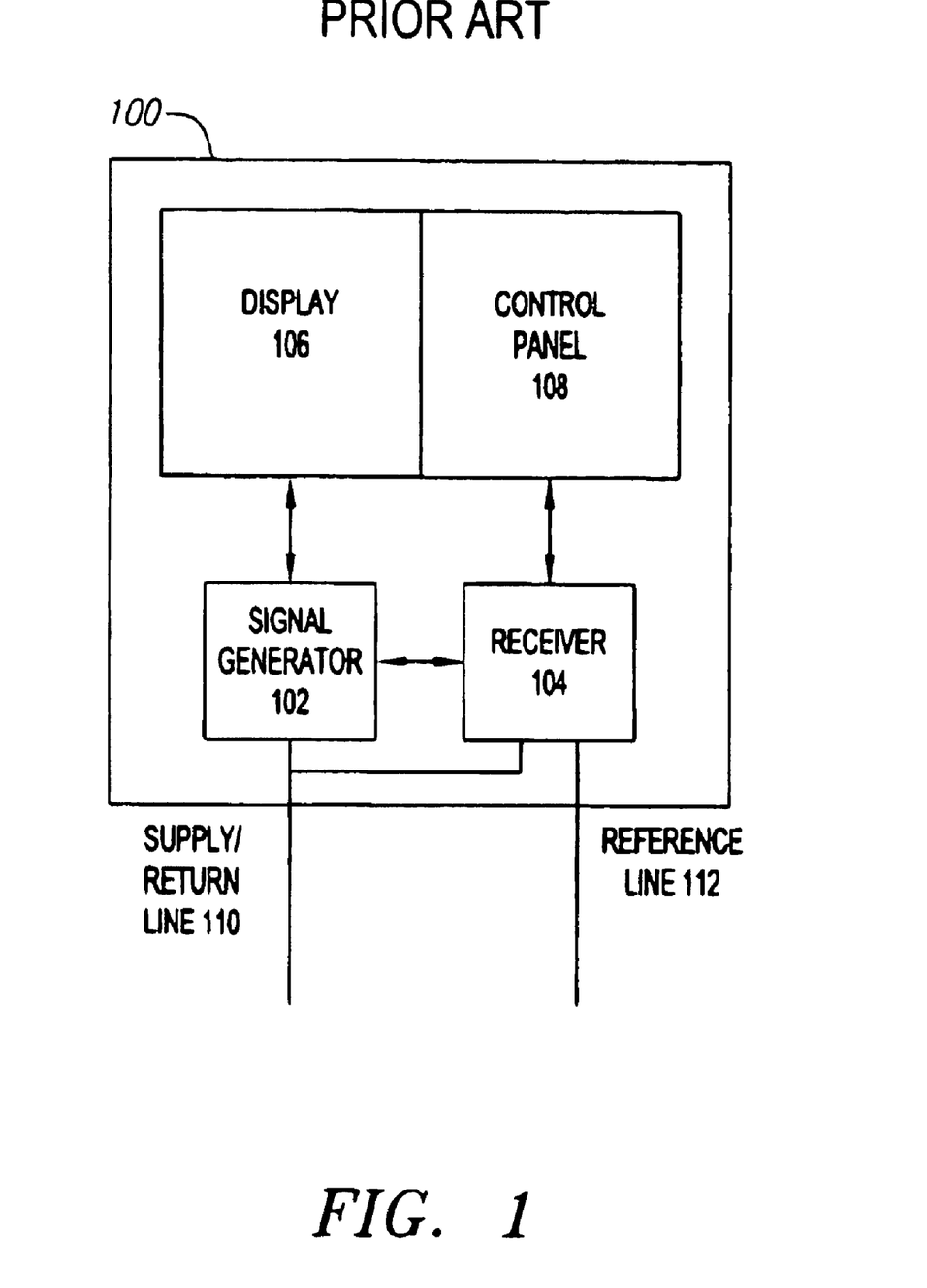
FIG. 1 is a simplified block diagram of a prior art time domain reflectometry device.

One testing device used to test conductors for faults and failures is a time domain reflectometry (TDR) device 100, which is shown in block diagram format in FIG. 1. The TDR device 100 includes a signal generator 102 for generating impulse and step signals, a receiver 104 for monitoring, receiving, and sampling (analog or digital) incident, reflected, and response signals, a display 106 for viewing the signals, and a control panel 108 for controlling the signal generator 102, the receiver 104, and the display 106.

Figure 2:
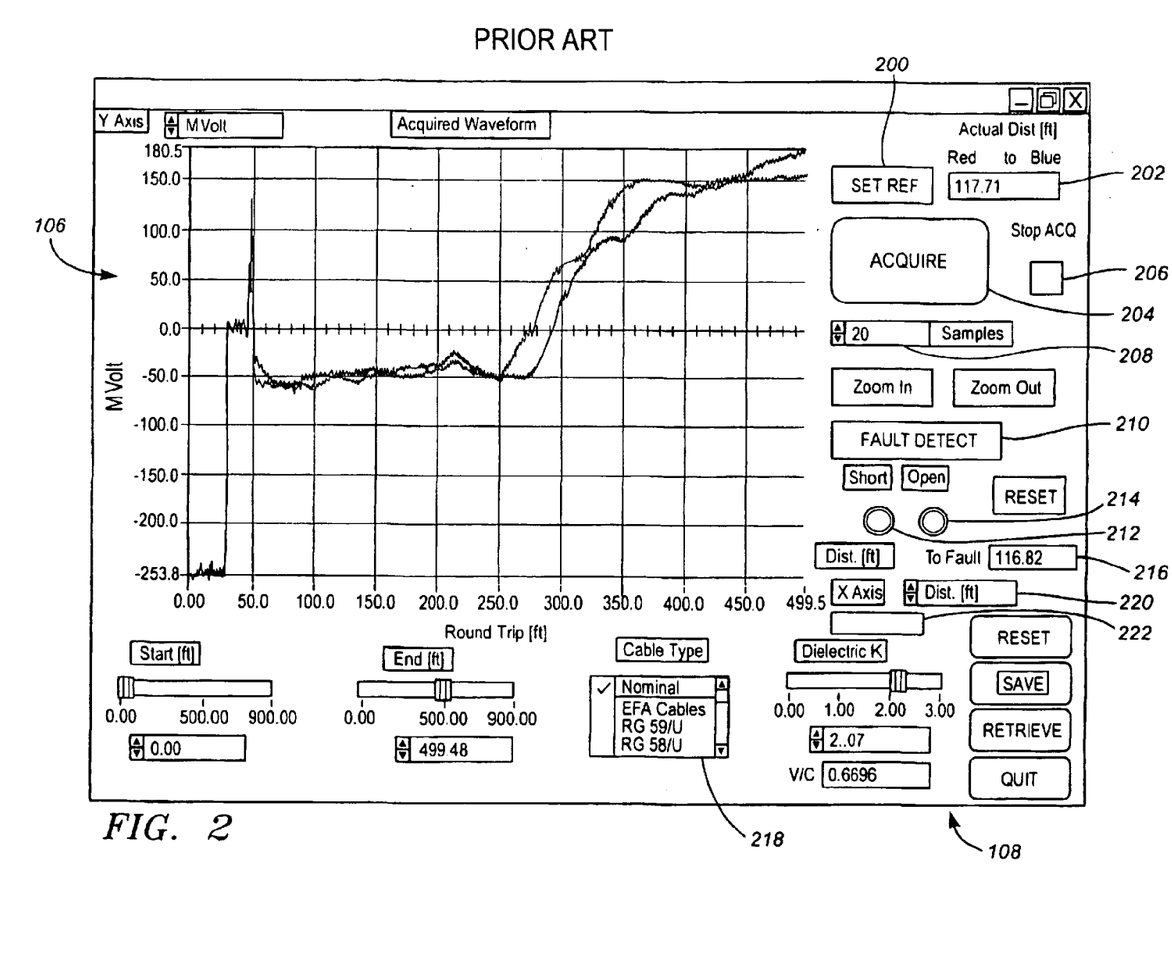
FIG. 2 is a front view of the display and control panel of the prior art time domain reflectometry device of FIG. 1.

FIG. 2 is a front view of the display 106 and control panel 108 of the prior art TDR device of FIG. 1. The control panel 108 includes a number of buttons, control knobs, fields, and indicator lights. For example, the control panel 108 might include a set reference button 200, a cursor distance (or time) field 202, an acquire button 204, a stop acquire button 206, a samples field 208, a fault detect button 210, a short indicator 212, an open indicator 214, a distance to the fault field 216, a conductor field 218, an x-axis units field 220, and a length of the longest conductor or segment field 222. Referring back to FIG. 1, the TDR device 100 also include a supply/return line 110 coupled to the signal generator 102 for propagating the impulse signals and coupled to the receiver 104 for propagating the reflected signals, and a reference line 112 for providing a reference for the impulse and reflected signals. The TDR device 100 transmits and receives impulse and reflected signals across a conductor to determine if the conductor has a fault, e.g., a break or a short, and to determine the distance to the fault. Many other testing devices are also currently available that can be used to test conductors for faults and failures.

To test a conductor, the TDR device 100 is connected to one end of the conductor and transmits an impulse signal towards the other end of the conductor. Since impulse signals respond to changes in impedance, any break or short in the conductor causes an incident signal to be reflected back to the TDR device 100. Having prior knowledge of the length of the conductor, the user can determine if the conductor has a break or short and the distance to the break or short based on the time it takes for the incident signal to return to the TDR device 100. This method for testing is viable for testing a single conductor, however, is not feasible for testing branch conductors that are commonly in aircraft, ship or other vehicle wire harnesses.

Thus, it should be appreciated that there is a need for a break or short test method for aircraft wire harnesses with branch conductors. The present invention fulfils this need as well as others.

SUMMARY OF THE INVENTION

The methods of the present invention described herein are not enhancements of any particular TDR device or method for testing conductors for faults and failures. Rather, the methods of the present invention are separate and distinct concepts that can be used with any testing device such as the TDR device previously referenced. The present invention provides a method for testing aircraft wire harnesses with branch conductors to determine the location of shorts and breaks. More specifically, and by way of example only, one embodiment of the present invention is a method for isolating a fault in an aircraft wire harness. The method includes coupling a reference line to a reference point, coupling a supply/return line to a lead conductor, and transmitting an impulse signal along the lead conductor. The method further includes coupling the supply/return line to a first branch conductor, and transmitting a signal along the first branch conductor.

Another embodiment of the present invention is a method for isolating a fault in an aircraft circuit having a lead conductor and a plurality of branch conductors coupled to the lead conductor. The method includes coupling a reference line of a device to a ground of the lead conductor, coupling a supply/return line of the device to the lead conductor, supplying an impulse signal to the supply/return line, and receiving a reflected signal that is produced from the impulse signal. The method also includes determining whether a fault exists in the plurality of branch conductors using the reflected signal, coupling the reference line of the device to a ground of the plurality of branch conductors, coupling the supply/return line of the device to one of the plurality of branch conductors, and supplying a signal to the supply/return line.

Another embodiment of the present invention is a method for locating a fault in a plurality of branch conductors. The method includes providing a lead conductor and a plurality of branch conductors, positioning a reference line to electrically contact a first reference point, and positioning a signal line to electrically contact the lead conductor. The method also includes providing a first test signal to the signal line, receiving an incident signal on the signal line, determining whether a fault exists in the plurality of branch conductors using the incident signal, positioning the signal line to electrically contact one of the plurality of branch conductors, and providing a second test signal to the signal line.

These and other features and advantages of the preferred embodiment of the invention will become apparent from the following detailed description, taken in conjunction with the accompanying drawings, which illustrate, by way of example the principles of the invention.

DETAILED DESCRIPTION OF THE PRESENTLY PREFERRED EMBODIMENTS

Methods that implement the embodiments of the various features of the present invention will now be described with reference to the drawings. The drawings and the associated descriptions are provided to illustrate embodiments of the present invention and not to limit the scope of the present invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

Figure 3:
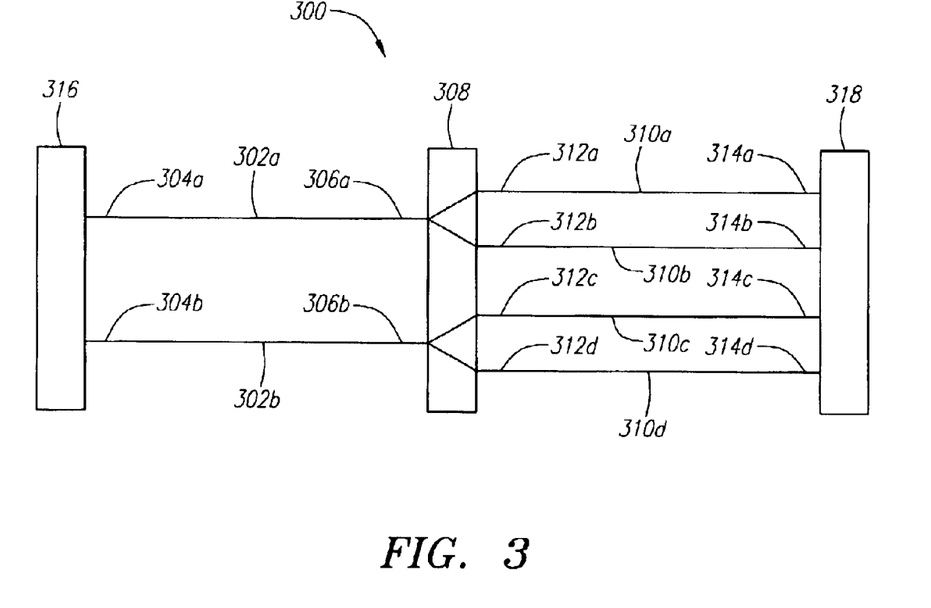
FIG. 3 is a schematic diagram of a simplified circuit used to illustrate an embodiment of the present invention.

Referring now more particularly to the drawings, FIG. 3 is a schematic diagram of a simplified circuit 300 used to illustrate an embodiment of the present invention. The circuit 300 including a number of lead conductors 302, each having first and second ends 304, 306, a connector 308, and a number of branch conductors 310, each having first and second ends 312, 314. The lead conductors 302 can also be referred to as common conductors or trunk conductors and the branch conductors 310 can also be referred to as limb conductors. Each conductor can be covered with an insulator such as plastic or rubber. The second end 306 of each lead conductor 302 and the first end 312 of each branch conductor 310 are coupled to the connector 308. The connector 308 electrically couples each lead conductor 302 to one or more branch conductors 310. The connector 308 can also be removed and the lead conductor 302 can be connected to the branch conductors 310. The circuit 300 might also have a lead connector 316 that is coupled to the first end 304 of each lead conductor 302 and a branch connector 318 that is coupled to the second end 314 of each branch conductor 310. The connectors are used for positioning the conductors in place and isolating the conductors from one another by fixed distances. The connectors can be a terminal block, a circular connector, a square connector, or a D-sub connector.

Figure 4:
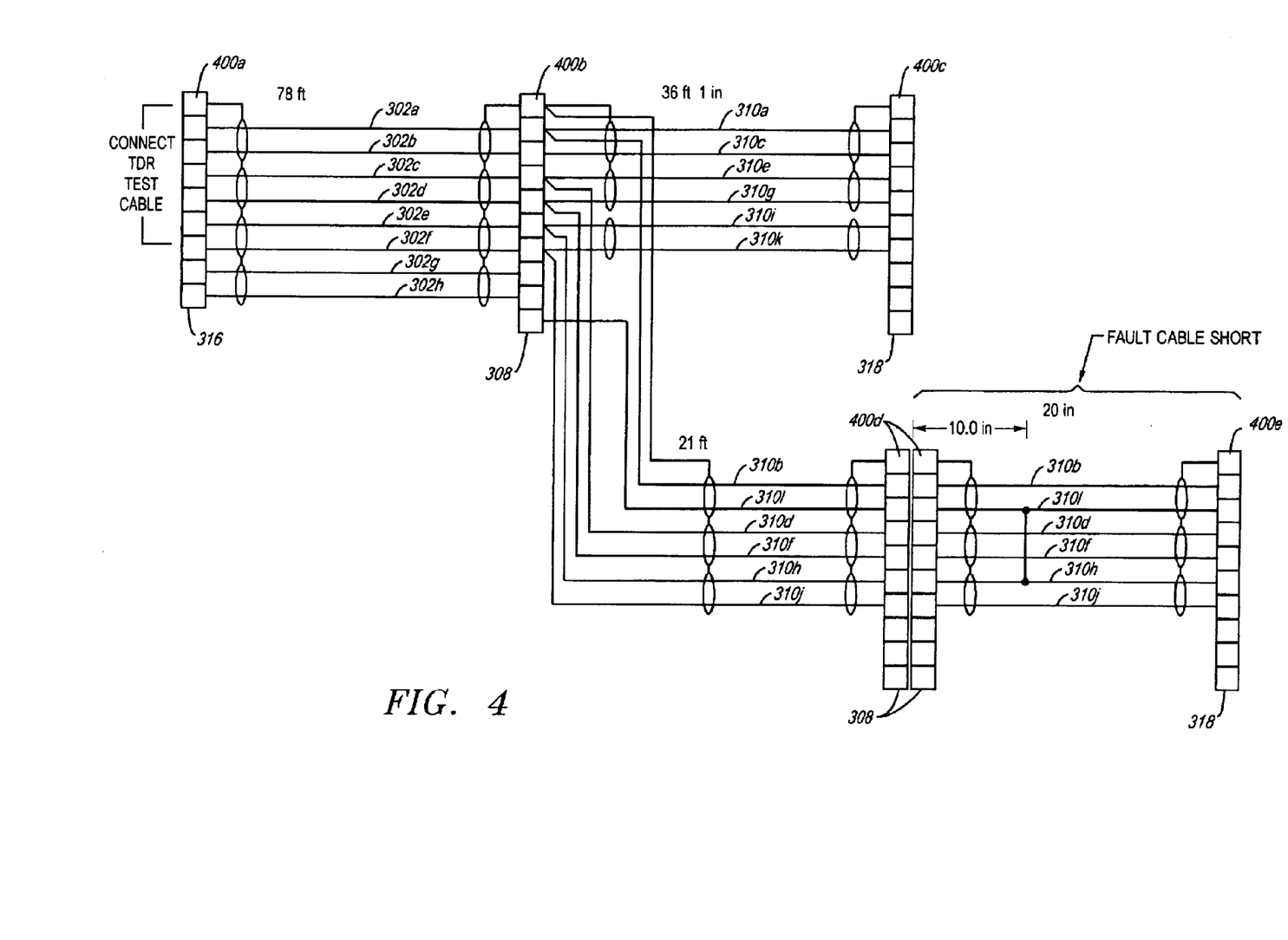
FIG. 4 is a schematic diagram of the circuit of FIG. 3 with additional lead conductors, connectors, and branch conductors where two of the branch conductors are shorted together to illustrate an embodiment of the present invention.

FIG. 4 is a schematic diagram of the circuit 300 of FIG. 3 with additional lead conductors 302, connectors 308, 318, and branch conductors 310 where two of the branch conductors 310h, 310l are shorted together to illustrate an embodiment of the present invention. The circuit 300 can have multiple branch conductors, e.g., branch conductors 310b, 310d, 310j, shorted together. The circuit 300 can also have a short from one branch conductor, e.g., branch conductor 310b, to another conductor (not shown). The connectors each have a shield 400 for providing a common ground for the conductors.

Figures 5, 5A:
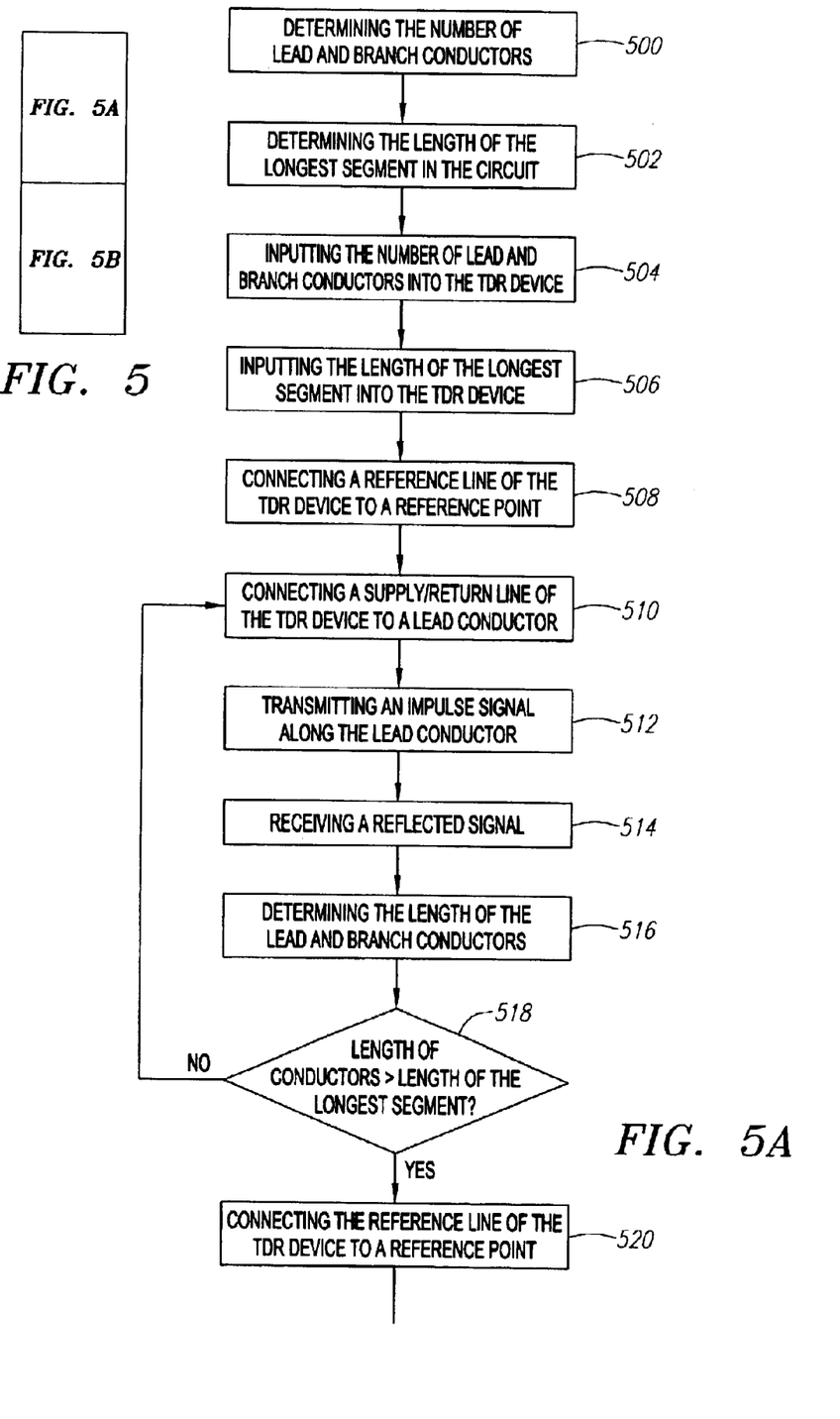
FIG. 5 is a simplified flow chart illustrating a method for isolating a short in the circuit of FIG. 4.
Figure 5B:
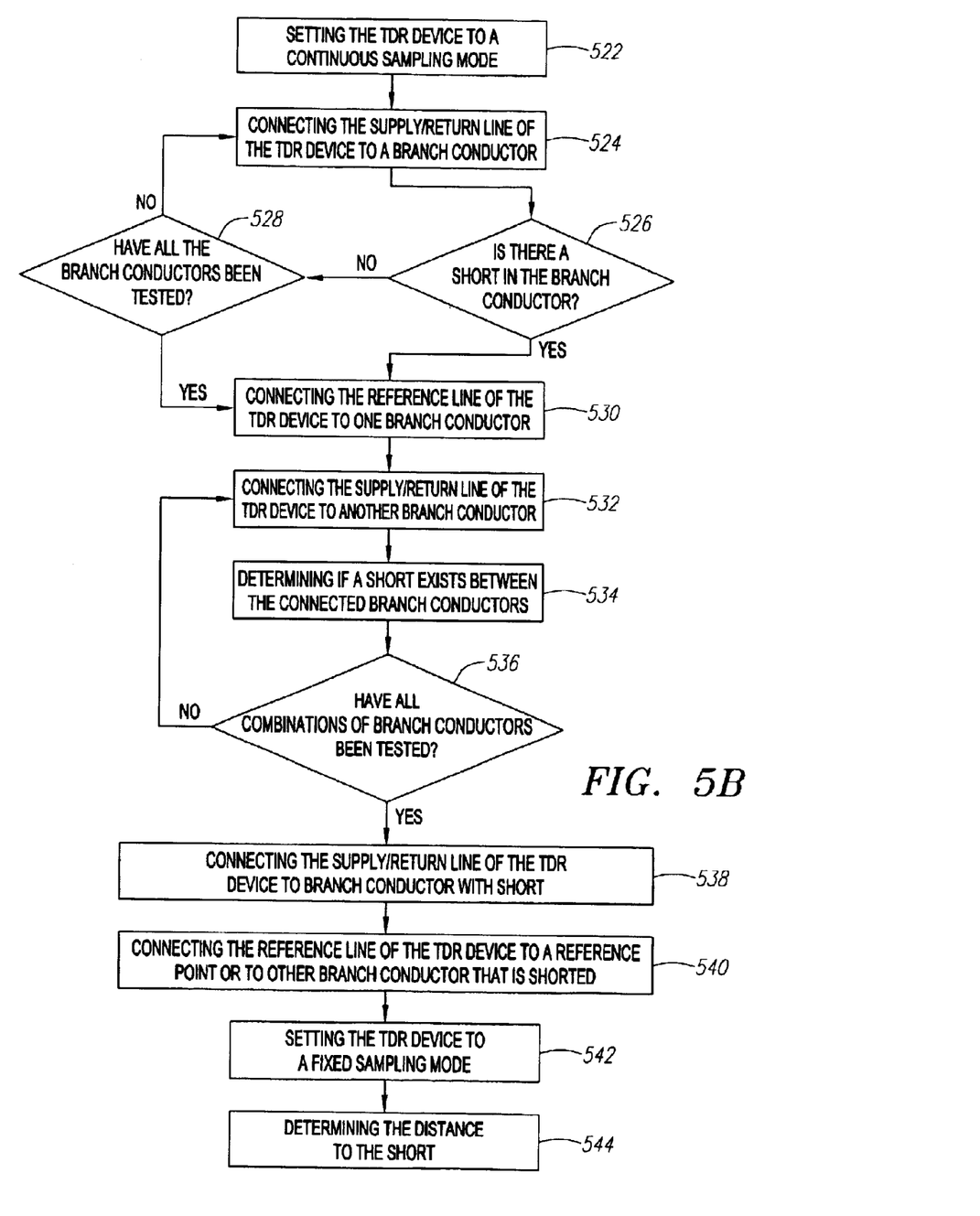

FIG. 5 is a simplified flow chart illustrating a method for isolating a short in the circuit of FIG. 4. FIGS. 1–4 are referred to when describing the details of FIG. 5 to facilitate an understanding of the method for isolating the short. Thus, FIGS. 1–4 are provided as examples and are not intended to limit the scope of the present invention. The number of lead and branch conductors 302, 310 in the circuit 300 is determined at 500. The length of the longest segment, e.g., the longest lead conductor 302 plus the longest branch conductor 310 that are coupled together, in the circuit 300 is known or measured at 502. The length is generally measured by adding the individual lengths of each conductor. In one embodiment, the user knows the length of each conductor in the circuit 300 and determines the length of the longest segment by adding the lengths of the longest conductors. Using FIG. 4 as an example, the number of lead conductors 302 is 8, the number of branch conductors 310 is 12, and the length of the longest segment is 114 feet, 1 inch. The number of lead and branch conductors 302, 310 can be input into the TDR device 100 via the control panel 108 (504). The user might also know the conductor type or the velocity of propagation of the conductors. The conductor type or the velocity of propagation can be input into the TDR device 100 via the conductor field 218 and the length of the longest segment can be input into the TDR device 100 via the length of the longest segment field 222 (506).

The user connects the reference line 112 to a ground or a reference point, e.g., the shield 400a, that is common to the lead conductors 302 (508) and the supply/return line 110 to the first end 304 of one of the lead conductors 302, e.g., lead conductor 302a (510). On the control panel 108, the user sets the samples field 208 to "impulse" and pushes the acquire button 204 to command the signal generator 102 to generate an impulse signal that is output to the supply/return line 110 and transmitted across the lead conductor 302 to the branch conductors 310 (512). In one embodiment, the impulse signal is a 200 picosecond impulse. When the impulse reaches a change in impedance, e.g., an open, a reflected signal is reflected back to the receiver 104, which samples the reflected signal (514). The reflected signal represents the combined impedance of the lead conductor 302 and the branch conductors 310.

Figure 6:
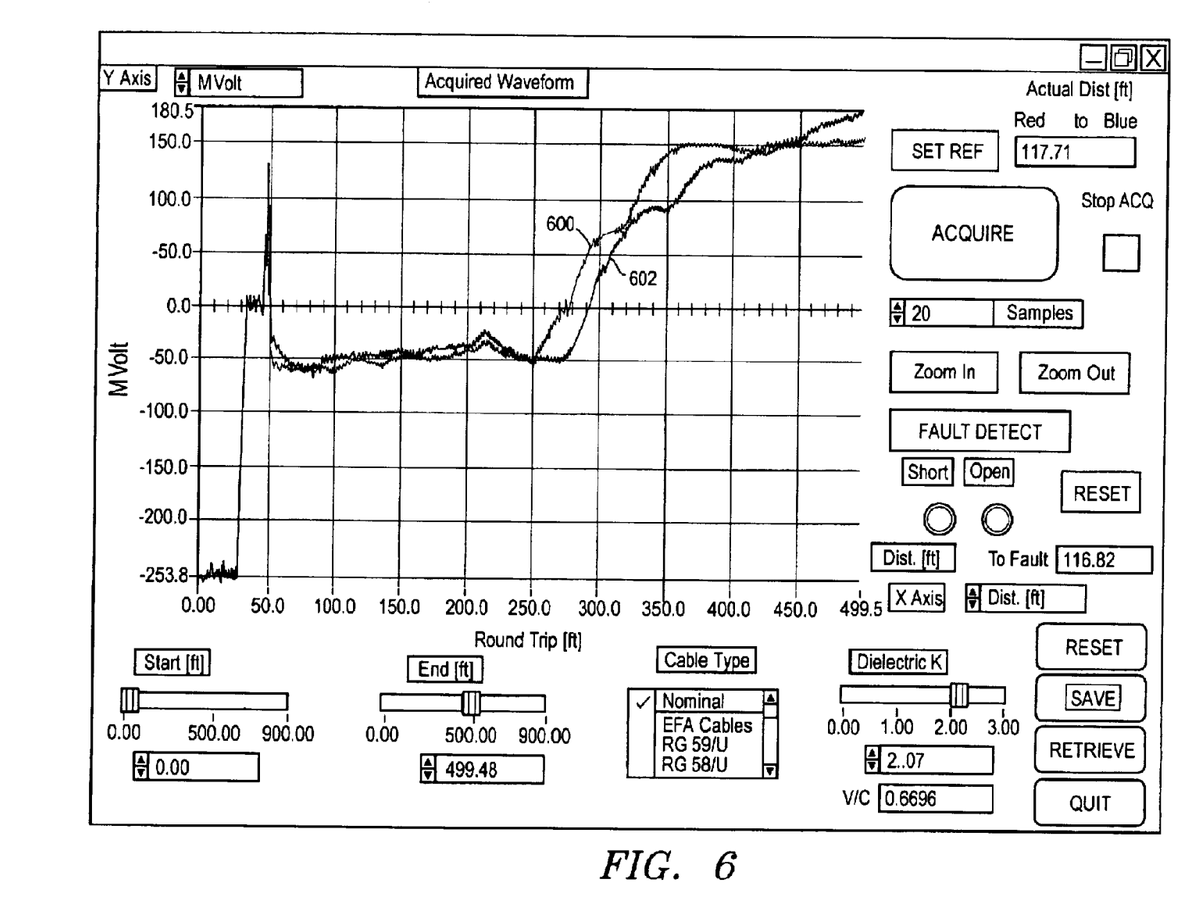
FIG. 6 shows two waveforms displayed on the display in a voltage versus time graphical format.

FIG. 6 shows two waveforms displayed on the display 106 in a voltage versus time graphical format. The first waveform 600 represents a first reflected signal that traveled across conductors without a short and the second waveform 602 represents a second reflected signal that traveled across conductors with a short. The second reflected signal arrived at the receiver 104 after the first reflected signal because the impulse signal traveled a greater distance, due to the short, before being reflecting back. That is, the short is perceived as an extension of the conductor. Thus, the two waveforms do not overlap.

From the waveform, the user determines the elapsed time, which is the time the impulse signal and the reflected signal travel along the conductors 302, 310, and the length of the conductors 302, 310 (516). The user can determine the elapsed time by placing a first cursor on the impulse signal and a second cursor on the reflected signal. The user can determine the length of the conductors 302, 310 by multiplying the velocity of propagation times the speed of light times one-half the elapsed time. In one embodiment, the TDR device 100 determines the length of the conductors and displays the length on the display 106. The length is the distance the impulse signal and the reflected signal travel along the conductors.

At 518, the user determines if the length of the conductors (516) is greater than the length of the longest segment (502). If the length is not greater, then the conductors do not have a short and the user connects the supply/return line 110 to the first end 304 of the next lead conductor, e.g., lead conductor 302b (return to 510). If the length is greater, then at least one of the branch conductors, e.g., branch conductor 310a or branch conductor 310b, has a short (518). Once it is determined that a short exists in the branch conductors, the branch conductor(s) with the short needs to be identified.

Figure 7:
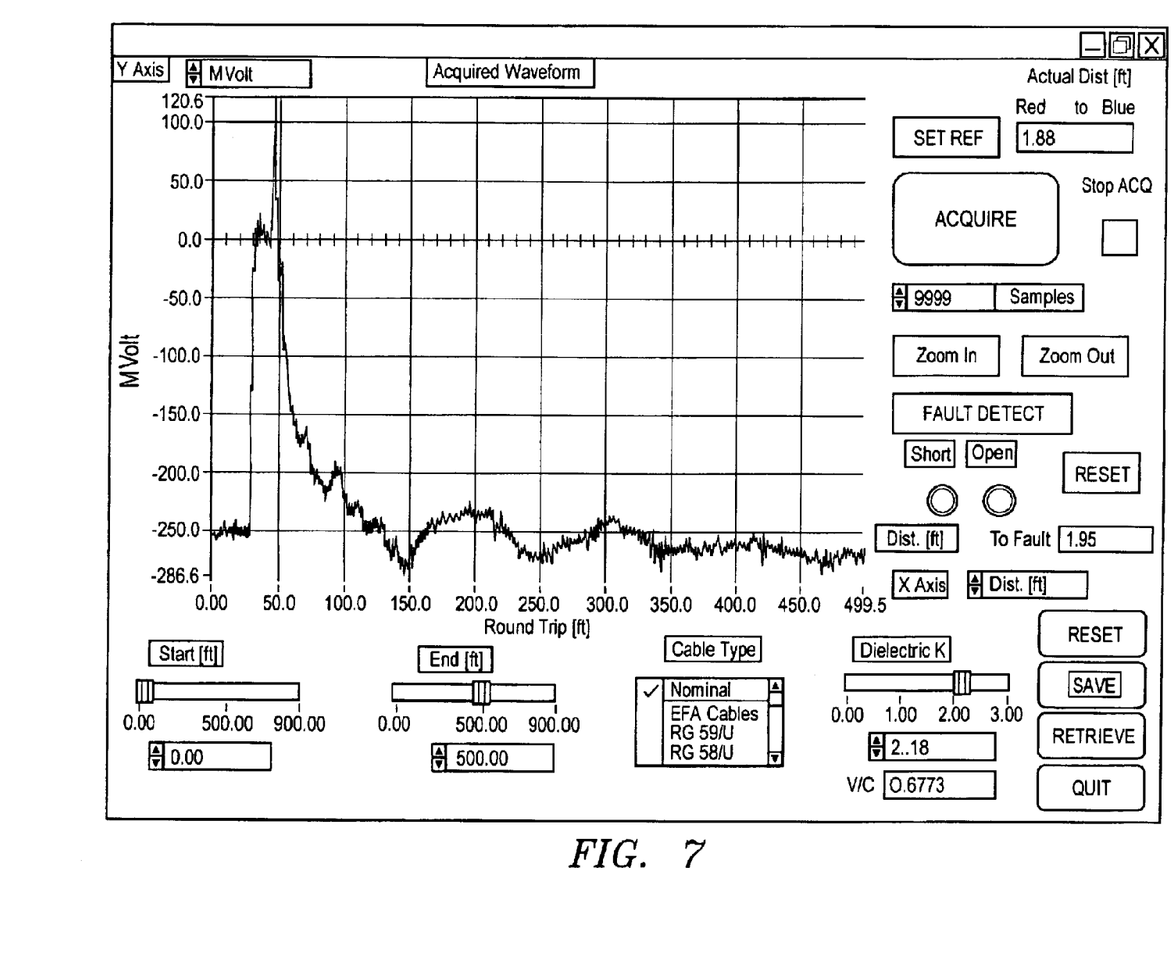
FIG. 7 shows the waveform of the reflected signal decreasing over time, thus indicating a short.

The user connects the reference line 112 to a ground or a reference point, e.g., the shield 400e, which is common to the branch conductors 310 suspected of having the short (520). The signal generator 102 is placed in a continuous sampling mode by inputting or setting the samples field 208 to "99999" and selecting the acquire button 204 on the control panel 108 (522). The supply/return line 110 is connected to one of the branch conductors 310 suspected of having the short (524) and a continuous signal is output to the supply/return line 110 and transmitted across the branch conductor 310. If the user suspects that a particular branch conductor is the one with the short, the supply/return line 110 may be first connected to that branch conductor 310. The continuous signal reflects back from, for example, the first end 304 of the lead conductor 302, to produces a reflected signal that is returned to the receiver 104 and displayed on the display 106. The display 106 is observed to determine if the waveform of the reflected signal changes to a short (526). If the amplitude of the waveform of the reflected signal increases over time, then the branch conductor connected to the supply/return line 110 has an open. If the amplitude of the waveform of the reflected signal decreases over time, then the branch conductor connected to the supply/return line 110 has a short. FIG. 7 shows the waveform of the reflected signal decreasing over time, thus indicating a short. The supply/return line 110 is connected to each branch conductor 310 suspected of having the short, one at a time, and the display 106 is observed to determine if the reflected signal changes to a short.

Once the supply/return line 110 has been connected to each branch conductor 310, the branch conductors 310 are tested to determine if a short exists between two or more of the branch conductors (528). For example, FIG. 4 shows a short between branch conductor 310h and branch conductor 310l. To test the branch conductors 310, the reference line 112 is connected to one branch conductor, e.g., 310b, (530) and the supply/return line 110 is connected to another branch conductor, e.g., 310l, (532) to determine if a short exists between these two branch conductors (534). Typically, the user observes the display 106 to determine if the reflected signal changes from an open to a short. In one embodiment, the short indicator 212 is illuminated if a short is detected. The supply/return line 110 is moved to the next branch conductor, e.g., 310d, until the remaining branch conductors have been tested, e.g., until branch conductor 310j has been tested. Thereafter, the reference line 112 is moved to the next branch conductor, e.g., 310l, and the supply/return line 110 is moved to the next branch conductor, e.g., 310d, until the remaining branch conductors have been tested. Hence, the reference line 112 is connected to one branch conductor while the supply/return line 110 is cycled through the remaining branch conductors. The supply/return line 110 and the reference line 112 are connected to various branch conductors to ensure that all combinations of the branch conductors have been tested (536). At this point, the short(s) in the branch conductors have been identified.

The stop acquire button 206 is selected to stop the continuous sampling mode. The supply/return line 110 is connected to one branch conductor with the short (538) and the reference line 112 is connected to (1) the ground or the reference point (if short is in one conductor) or (2) the other branch conductor with the same short (if the short is between two or more conductors) (540). The samples field 208 is set to a fixed number of samples, e.g., 10, and the acquire button 204 is selected to transmit a signal along the branch conductor with the short (542). When the signal reaches the short, a reflected signal is reflected back to the receiver 104. The display 106 is observed and the distance to the short is determined using the elapsed time and the velocity of propagation (544). In one embodiment, the user selects the fault detect button 210, the receiver 104 automatically determines the distance to the short, and the distance to the fault field 216 displays the distance to the short.

Figure 8:
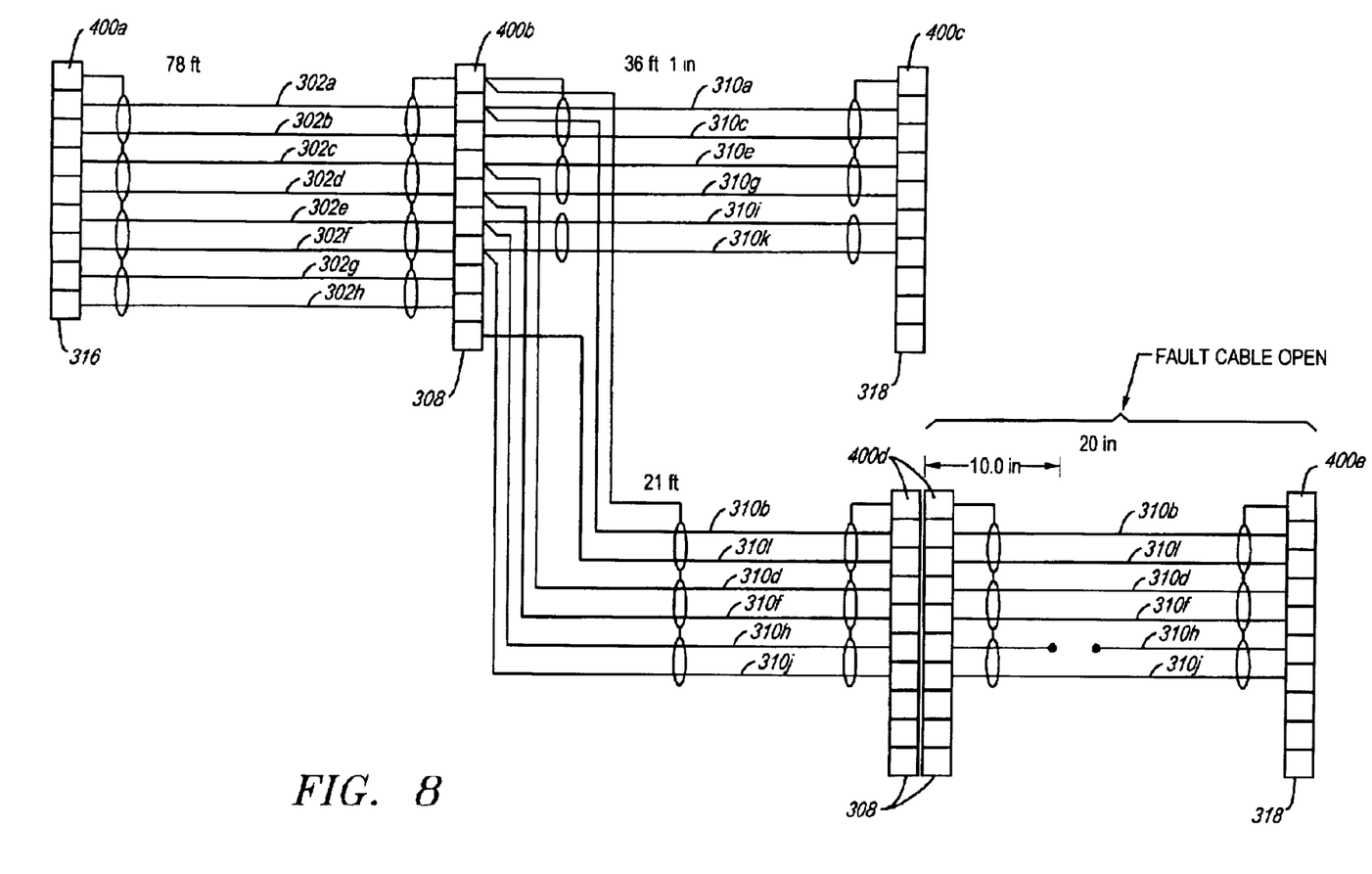
FIG. 8 is a schematic diagram of the circuit of FIG. 3 with additional lead conductors, connectors, and branch conductors where the branch conductor has an open to illustrate an embodiment of the present invention.

FIG. 8 is a schematic diagram of the circuit 300 of FIG. 3 with additional lead conductors 302, connectors 308, 318, and branch conductors 310 where the branch conductor 310h has an open to illustrate an embodiment of the present invention. The circuit 300 can have multiple branch conductors, e.g., branch conductors 310b, 310d, 310j, that have opens.

Figures 9, 9A:
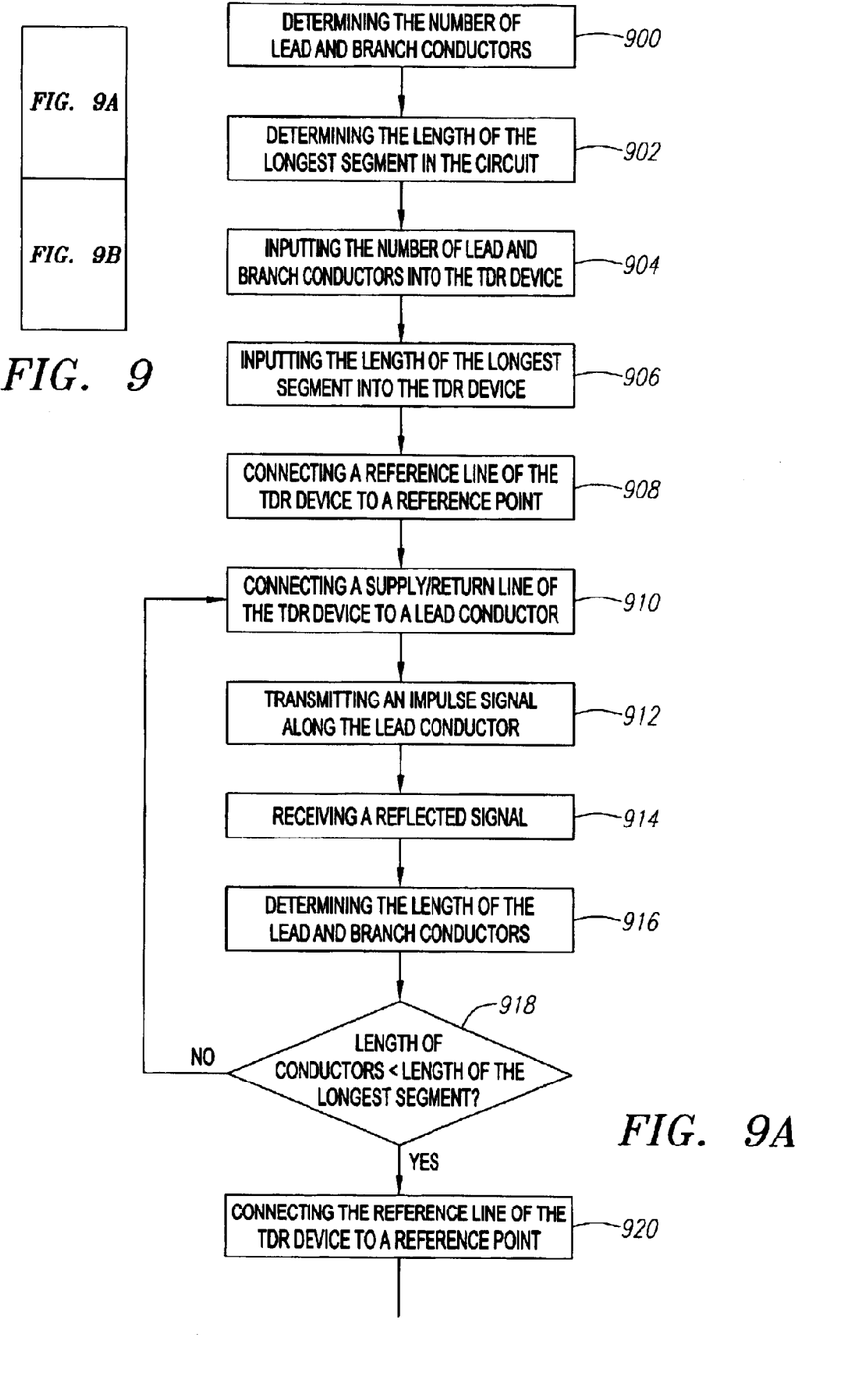
FIG. 9 is a simplified flow chart illustrating a method for isolating an open in the circuit of FIG. 8.
Figure 9B:
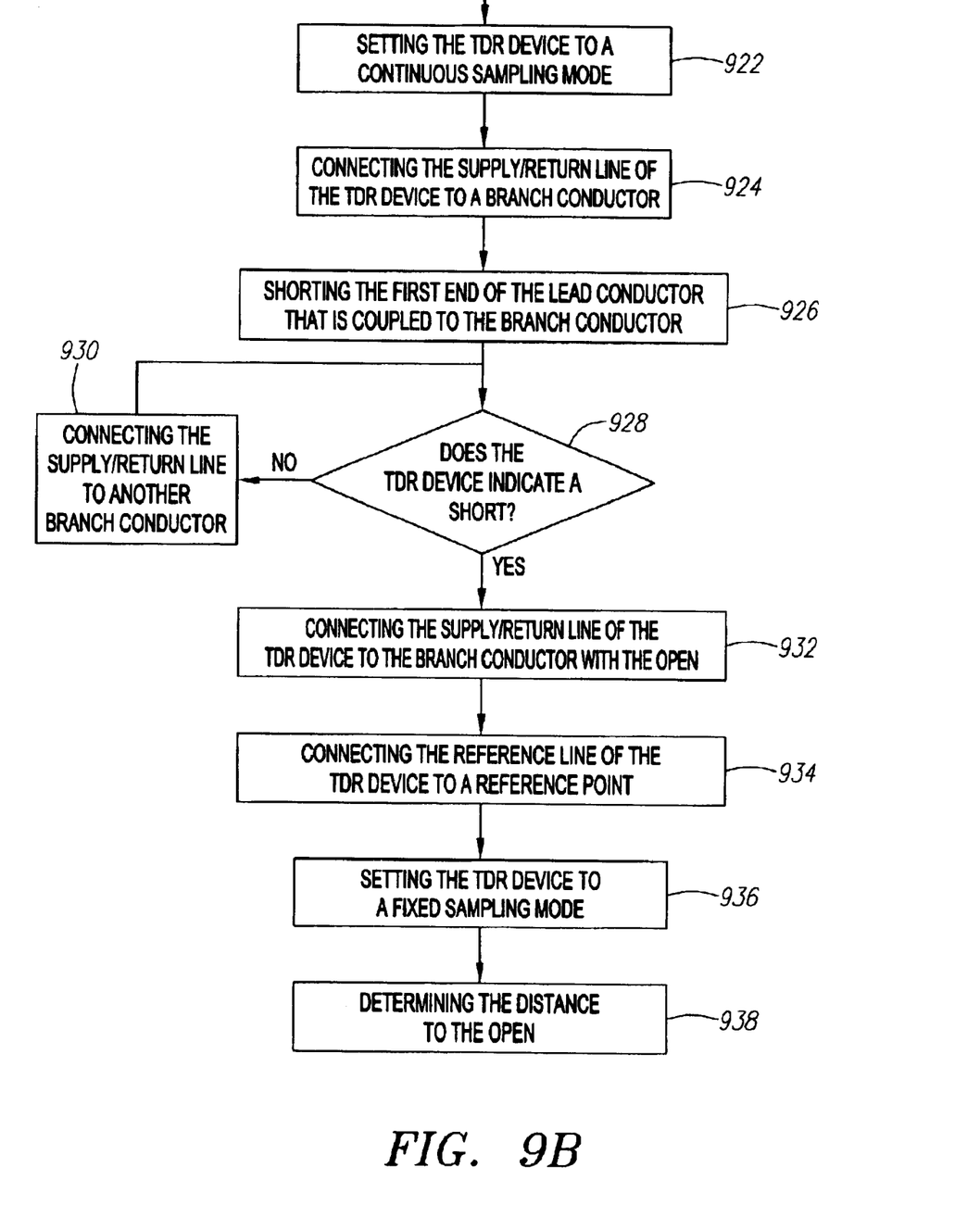

FIG. 9 is a simplified flow chart illustrating a method for isolating an open in the circuit of FIG. 8. FIG. 8 is referred to when describing the details of FIG. 9 to facilitate an understanding of the method for isolating the open. Thus, FIG. 8 is provided as an example and is not intended to limit the scope of the present invention.

At 900, the number of lead and branch conductors 302, 310 in the circuit 300 is determined. The length of the longest segment in the circuit 300 is known or measured at 902. The length is generally measured by adding the individual lengths of each conductor. In one embodiment, the user knows the length of each conductor in the circuit 300 and determines the length of the longest segment by adding the lengths of the longest conductors. Using FIG. 8 as an example, the number of lead conductors 302 is 8, the number of branch conductors 310 is 12, and the length of the longest segment is 114 feet, 1 inch. The number of lead and branch conductors 302, 310 can be input into the TDR device 100 via the control panel 108 (904). The user might also know the conductor type or the velocity of propagation of the conductors. The conductor type or the velocity of propagation can be input into the TDR device 100 via the conductor field 218 and the length of the longest segment can be input into the TDR device 100 via the length of the longest segment field 222 (906).

The user connects the reference line 112 to a ground or a reference point, e.g., the shield 400a, that is common to the lead conductors 302 (908) and the supply/return line 110 to the first end 304 of one of the lead conductors 302, e.g., lead conductor 302a (910). On the control panel 108, the user sets the samples field 208 to "impulse" and pushes the acquire button 204 to command the signal generator 102 to generate an impulse signal that is output to the supply/return line 110 and transmitted across the lead conductor 302 to the branch conductors 310 (912). In one embodiment, the impulse signal is a 200 pico second impulse. When the impulse reaches a change in impedance, e.g., an open, a reflected signal is reflected back to the receiver 104, which samples the reflected signal (914). The reflected signal represents the combined impedance of the lead conductor 302 and the branch conductors 310.

Figure 10:
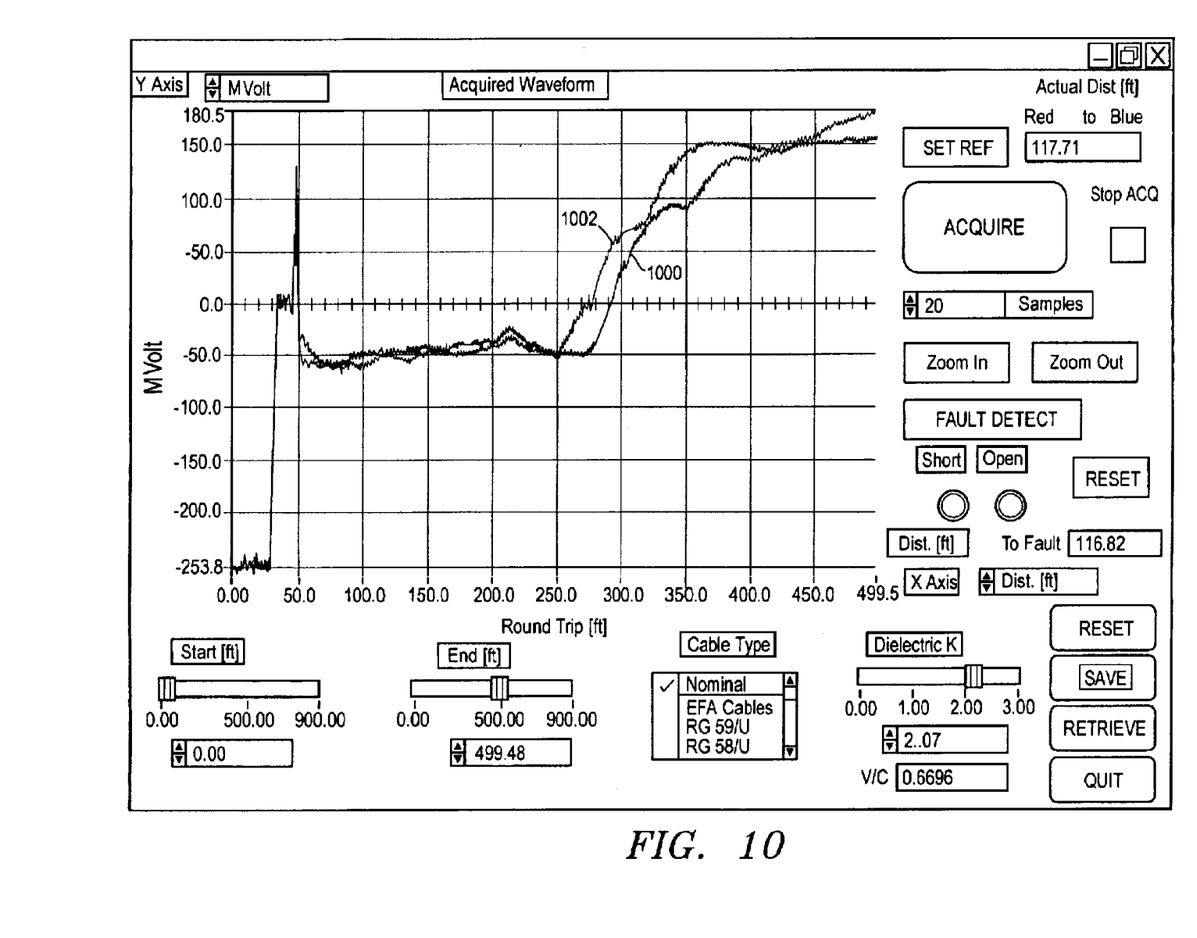
FIG. 10 shows two waveforms displayed on the display in a voltage versus time graphical format.

FIG. 10 shows two waveforms displayed on the display 106 in a voltage versus time graphical format. The first waveform 1000 represents a first reflected signal that traveled across the conductors without encountering an open in the branch conductors and the second waveform 1002 represents a second reflected signal that traveled across the conductors and encountered an open in at least one of the branch conductors 310 before reaching the connector 318. The second reflected signal arrived at the receiver 104 before the first reflected signal because the impulse signal traveled a shorter distance, due to the open, before being reflecting back. That is, the open is perceived as a shortening of the conductor. Hence, the two waveforms do not overlap.

From the waveform, the user determines the elapsed time, which is the time the impulse signal and the reflected signal travel along the conductors 302, 310, and the length of the conductors 302, 310 (916). The user can determine the elapsed time by placing a first cursor on the impulse signal and a second cursor on the reflected signal. The user can determine the length of the conductors 302, 310 by multiplying the velocity of propagation times the speed of light times one-half the elapsed time. In one embodiment, the TDR device 100 determines the length of the conductors and displays the length on the display 106. The length is the distance the impulse signal and the reflected signal travel along the conductors.

At 918, the user determines if the length of the conductors (916) is less than the length of the longest segment (902). If the length is not shorter, then the conductors do not have an open and the user connects the supply/return line 110 to the first end 304 of the next lead conductor, e.g., lead conductor 302*b* (return to 910). If the length is shorter, then at least one of the branch conductors, e.g., branch conductor 310*a* or branch conductor 310*b*, has an open (918). Once it is determined that an open exists in the branch conductors, the branch conductor(s) with the open need to be identified.

The user connects the reference line 112 to a ground or a reference point, e.g., the shield 400*e*, which is common to the branch conductors 310 suspected of having the open (920). The signal generator 102 is placed in a continuous sampling mode by inputting or setting the samples field 208 to "99999" and selecting the acquire button 204 on the control panel 108 (922). The supply/return line 110 is connected to one of the branch conductors 310 suspected of having the open (924) and a continuous signal is output to the supply/return line 110 and transmitted across the branch conductor 310. If the user suspects that a particular branch conductor is the one with the open, the supply/return line 110 may be first connected to that branch conductor 310. The first end 304 of the lead conductor 302 that is coupled to the branch conductor 310 being tested is shorted (926). For example, if branch conductor 310*d* is being tested, then the first end 304 of the lead conductor 302*c* is shorted to ground. The continuous signal reflects back from, for example, the first end 304 of the lead conductor 302, to produces a reflected signal that is returned to the receiver 104 and displayed on the display 106. The display 106 is observed to determine if the waveform of the reflected signal changes from an open to a short (928). If the TDR device 100 indicates a short, either via the display 106 or the short indicator 212, the branch conductor being tested does not have an open. This indicates the branch conductor being tested is good. If the TDR device 100 indicates an open, either via the display 106 or the open indicator 214, the branch conductor being tested has an open. This indicates the branch conductor being tested has a fault. If the open has not been identified, the supply/return line 110 is connected to each branch conductor 310 suspected of having the open, one at a time, and the TDR device 100 is observed to determine if the reflected signal changes from an open to a short (930).

Once the open has been identified, the stop acquire button 206 is selected to stop the continuous sampling mode. The supply/return line 110 is connected to the branch conductor with the open (932) and the reference line 112 is connected to the ground or the reference point, e.g., shield 400*e*, of the branch conductor (934). The samples field 208 is set to a fixed number of samples, e.g., 10, and the acquire button 204 is selected to transmit a signal along the branch conductor with the open (936). When the signal reaches the open, a reflected signal is reflected back to the receiver 104. The display 106 is observed and the distance to the open is determined using the elapsed time and the velocity of propagation (938). In one embodiment, the user selects the fault detect button 210, the receiver 104 automatically determines the distance to the open, and the distance to the fault field 216 displays the distance to the open.

Although an exemplary embodiment of the invention has been shown and described, many other changes, combinations, omissions, modifications and substitutions, in addition to those set forth in the above paragraphs, may be made by one having ordinary skill in the art without necessarily departing from the spirit and scope of this invention. For example, the term "user" can be replaced with the term "automated device" throughout the description. That is, an automated device can be used to perform the operations that are performed by the user. For example, the automated device can be used to make the connections between the TDR device and the circuit. Accordingly, the present invention is not intended to be limited by the preferred embodiments, but is to be defined by reference to the appended claims.

What is claimed is:

1. A method for isolating a fault in an aircraft wire harness including a plurality of lead conductors, a plurality of branch conductors, and one or more reference points, each lead conductor coupled to one or more branch conductors to form a plurality of segments each having a length, the method comprising:

determining which segment length is longest;

coupling a reference line of a time domain reflectometry (TDR) device to one of the reference points;

coupling a supply/return line of the TDR device to an end of a selected one of the lead conductors;

transmitting a first test signal from the TDR device along the segment associated with the selected lead conductor to determine the length of the segment associated with the selected lead conductor;

determining whether the segment associated with the selected lead conductor is faulty, based on the determined length;

if the segment associated with the selected lead conductor is faulty, coupling the supply/return line to a selected one of the branch conductors; and transmitting a second test signal along the selected branch conductor.

2. The method of claim 1, wherein the first test signal is an impulse signal and the second test signal is a continuous signal.

3. The method of claim 1, further comprising receiving a reflected signal that is produced from the first test signal.

4. The method of claim 3, further comprising determining an elapsed time between the transmission of the first test signal and the receipt of the reflected signal.

5. The method of claim 1, wherein if the length of the segment associated with the selected lead conductor is greater than the length of the longest segment, then a short exists in one of the branch conductors coupled to the selected lead conductor.

6. The method of claim 1, wherein if the length of the segment associated with the selected lead conductor is less than the length of the longest segment, then an open exists in one of the branch conductors coupled to the selected lead conductor.

7. The method of claim 1, further comprising coupling the reference line to the selected branch conductor.

8. The method of claim 1, wherein the first test signal is an impulse signal and the second test signal is a fixed signal.

9. The method of claim 1, wherein the steps of coupling the reference line coupling the supply/return line to an end of a selected one of the lead conductors, and coupling the supply/return line to the selected one of the branch conductors are automated.

10. A method for isolating a fault in an aircraft circuit having a plurality of lead conductors, a plurality of branch conductors, and a plurality of grounds, each lead conductor coupled to one or more branch conductors to form a plurality of segments each having a length, the method comprising:

determining which segment length is the longest;

coupling a reference line of a time domain reflectometry (TDR) device to a ground associated with a selected one of the lead conductors;

coupling a supply/return line of the TDR device to an end of the selected lead conductor;

supplying a first test signal from the TDR device to the supply/return line and the segment associated with the selected lead conductor to determine the length of the segment associated with the selected lead conductor;

receiving a reflected signal that is produced from the first test signal;

determining whether a fault exists in the plurality of branch conductors using first signal, reflected signal, and determined length;

if a fault exists in the plurality of branch conductors, coupling the reference line of the device to a ground associated with a selected one of the branch conductors;

coupling the supply/return line of the device to the selected branch conductor; and supplying a second test signal to the supply/return line and selected branch conductor.

11. The method of claim 10, further comprising shorting the selected lead conductor to the ground associated with the selected lead conductor to determine if the fault is an open.

12. The method of claim 10, further comprising decoupling the reference line from the ground associated with the selected branch conductors.

\* \* \* \* \*